United States Patent
de Ruijter

(10) Patent No.: US 9,831,836 B1
(45) Date of Patent: Nov. 28, 2017

(54) AUTOMATIC GAIN CONTROL (AGC) CIRCUIT AND METHOD TO CONTROL AMPLIFIER GAIN BASED ON A DURATION OF AN OVERLOAD CONDITION

(71) Applicant: Silicon Laboratories Inc., Austin, TX (US)

(72) Inventor: Hendricus de Ruijter, Sunnyvale, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/287,892

(22) Filed: Oct. 7, 2016

(51) Int. Cl.
| H03F 1/52 | (2006.01) |
| H03G 3/30 | (2006.01) |
| H03F 3/19 | (2006.01) |
| H03F 3/21 | (2006.01) |

(52) U.S. Cl.
CPC .............. *H03F 1/52* (2013.01); *H03F 3/19* (2013.01); *H03F 3/21* (2013.01); *H03G 3/30* (2013.01); *H03F 2200/426* (2013.01); *H03F 2200/451* (2013.01)

(58) Field of Classification Search
CPC .... H03F 1/52; H03F 3/19; H03F 3/21; H03G 3/30
See application file for complete search history.

(56) References Cited

U.S. PATENT DOCUMENTS

| 6,038,435 | A | 3/2000 | Zhang |
| 6,212,244 | B1 | 4/2001 | Davidovici et al. |
| 6,614,806 | B1 | 9/2003 | Nanni |
| 9,001,475 | B2 * | 4/2015 | Lee .................. H02M 3/33507 361/18 |
| 2003/0139160 | A1 | 7/2003 | Yang |
| 2006/0222118 | A1 | 10/2006 | Murthy et al. |
| 2008/0191914 | A1 * | 8/2008 | Van Veldhoven .... H03M 3/362 341/139 |
| 2015/0162924 | A1 * | 6/2015 | Takaike .................. H03M 1/12 341/118 |

OTHER PUBLICATIONS

Analog Devices, MT-073 Tutorial, "High Speed Variable Gain Amplifiers (VGAs)", WK, Rev. 0, Oct. 2008, 9 pgs.

* cited by examiner

*Primary Examiner* — Tuan Pham
(74) *Attorney, Agent, or Firm* — Egan Peterman Enders Huston

(57) ABSTRACT

An automatic gain control (AGC) circuit and method are provided herein to control the gain, and the gain step size, of an amplifier circuit based on a duration of a detected overload condition. According to one embodiment, a method of gain control may include comparing a received signal to a threshold value, detecting an overload condition if the received signal exceeds the threshold value, detecting a duration of the overload condition, and controlling the gain, and the gain step size, of the amplifier circuit based on the detected duration of the overload condition.

31 Claims, 10 Drawing Sheets

AUTOMATIC GAIN CONTROL (AGC) CIRCUIT AND METHOD TO CONTROL AMPLIFIER GAIN BASED ON A DURATION OF AN OVERLOAD CONDITION

BACKGROUND

1. Field of the Disclosure

This disclosure relates to automatic gain control (AGC) circuits and, more particularly, to AGC circuits and methods to control the gain, and the gain step size, of an amplifier circuit based on a duration of a detected overload condition.

2. Description of the Relevant Art

The following descriptions and examples are provided as background only and are intended to reveal information that is believed to be of possible relevance to the present disclosure. No admission is necessarily intended, or should be construed, that any of the following information constitutes prior art impacting the patentable character of the subject matter claimed herein.

Automatic Gain Control (AGC) circuits are used in many systems where the amplitude of an incoming signal can vary over a wide dynamic range. The primary role of an AGC circuit is to provide a relatively constant output amplitude and to prevent saturation or signal clipping in the signal chain, even as the amplitude of the input signal varies, so that circuits following the AGC circuit require less dynamic range. AGC circuits can be found in any system or device where signal saturation, clipping and/or wide amplitude variations in the output signal could lead to a loss of information or unacceptable system performance. For instance, AGC circuits are commonly used in wireless receivers, radar systems, audio/video devices and telephone systems, to name a few.

As a non-limiting example, a wireless receiver may include an AGC circuit to adjust the gain of one or more amplifiers included within the receiver to compensate for the wide dynamic range of a received radio frequency (RF) signal. The AGC circuits included within wireless receivers typically include a peak detector to compare the incoming RF signal to a higher threshold 10 and a lower threshold 12, as shown in the waveform illustrated in FIG. 1. Larger RF or IF signals 14 exceeding higher threshold 10 may cause the receiver to saturate, while smaller RF or IF signals 14 below lower threshold 12 may adversely affect receiver sensitivity. Therefore, the AGC circuit is generally configured to adjust the amplifier gain to a safe level between higher threshold 10 and lower thresholds 12 that maximizes receiver sensitivity, while avoiding receiver saturation.

Upon receiving RF or IF signal 14, the peak detector may generate a first pulse 16 that begins when the received signal 14 reaches the lower threshold 12 and ends when the received signal 14 falls below the lower threshold 12. The same (or different) peak detector may generate a second pulse 18 when the received signal 14 exceeds and falls below the higher threshold 10. A "peak" in the received signal 14 is detected when the received signal 14 reaches the higher threshold 10. To prevent the receiver from saturating, conventional AGC circuits are configured to reduce the amplifier gain by some small fixed amount (e.g., −3 dB) when a peak is detected in the RF signal 14. After waiting for the receiver to settle to the new gain level, the peak detector compares the received signal 14 to the higher 10 and lower 12 thresholds again. The amplifier gain may be reduced again if the received signal 14 exceeds the higher threshold 10, or may be increased by a small fixed amount (e.g., +3 dB) if the received signal 14 falls below the lower threshold 12. This trial-and-error process continues until the gain stabilizes to a safe level, or until the gain setting reaches a lower or higher limit.

When a relatively large signal is received, conventional AGC circuits that adjust the gain with fixed gain step sizes (e.g., +/−3 dB) must process many cycles of the received signal 14 before the gain stabilizes to a safe level, which results in a long settling time. In addition, each small gain adjustment made by the AGC circuit may result in an amplitude modulation (AM) to phase modulation (PM) conversion, which disturbs the phase of the modulated signal and corrupts the received bits of the demodulated signal. Reducing the gain with a bigger step size is generally undesirable in conventional AGC circuits, as this may cause the AGC loop to overshoot (i.e., reduce the gain too low), which affects receiver sensitivity. If the amplifier gain is set too low, a gain increase is required to bring the amplifier gain back to a safe level. This back and forth behavior causes undesirable ringing and settling delay in the AGC loop.

SUMMARY

The following description of various embodiments of receivers, automatic gain control (AGC) circuits and methods is not to be construed in any way as limiting the subject matter of the appended claims.

Generally speaking, the present disclosure provides various embodiments of AGC circuits and methods that improve upon conventional AGC circuits and methods by controlling the amplifier gain, and the gain step size, based on a duration of a detected overload condition. By adjusting the gain by a gain step size based on the overload duration, the embodiments of AGC circuits and methods described herein reduce settling delay in the AGC loop, enable large gain steps to be used without risking overshoot, and avoid corruption of the demodulated signal. The embodiments described herein also avoid the undesirable ringing typically produced in conventional AGC circuits that use the trial-and-error approach to control amplifier gain.

According to one embodiment, a method of gain control provided herein includes comparing a received signal to a threshold value, detecting an overload condition if the received signal exceeds the threshold value, detecting a duration of the overload condition, and controlling a gain of one or more amplifiers based on the detected duration of the overload condition. Various embodiments of automatic gain control (AGC) circuits implementing the disclosed method are also provided herein.

According to one embodiment, an AGC circuit provided herein includes a first peak detector, a first integrator and a controller. The first peak detector may be coupled to receive a received signal and a threshold value, and may be configured to detect an overload condition if the received signal exceeds the threshold value. The first integrator may be coupled to the first peak detector and configured to detect a duration of an overload condition (i.e., an overload duration) detected by the first peak detector. The controller may be coupled to receive the detected duration of the overload condition from the first integrator, and may be configured to control a gain of one or more amplifiers coupled to the AGC circuit based on the detected duration of the overload condition.

According to another embodiment, the AGC circuit may further include a second peak detector, a third peak detector and a second integrator. The second and third peak detectors may be coupled to receive the received signal and may be configured to detect when the received signal does not exceed the threshold value (i.e., a non-overload condition). The second integrator may be coupled to the second and third peak detectors and may be configured to detect a duration of the non-overload condition (i.e., a non-overload duration). In such an embodiment, the controller may be coupled to receive the detected overload duration from the first integrator and the detected non-overload duration from the second integrator, and may be configured to control the gain of the one or more amplifiers based on the detected overload duration and the detected non-overload duration.

According to yet another embodiment, the AGC circuit may further include a second peak detector and a second integrator. The second peak detector may be coupled to receive the received signal, and may be configured to detect one-half of a period of the received signal. The second integrator may be coupled to the second peak detector and may be configured to detect a duration of the one-half period of the received signal (i.e., a half period duration). In such an embodiment, the controller may be coupled to receive the detected overload duration from the first integrator and the detected half period duration from the second integrator, and may be configured to control the gain of the one or more amplifiers based on the detected overload duration and the detected half period duration.

BRIEF DESCRIPTION OF THE DRAWINGS

Other objects and advantages of the disclosure will become apparent upon reading the following detailed description and upon reference to the accompanying drawings.

Figure 1:
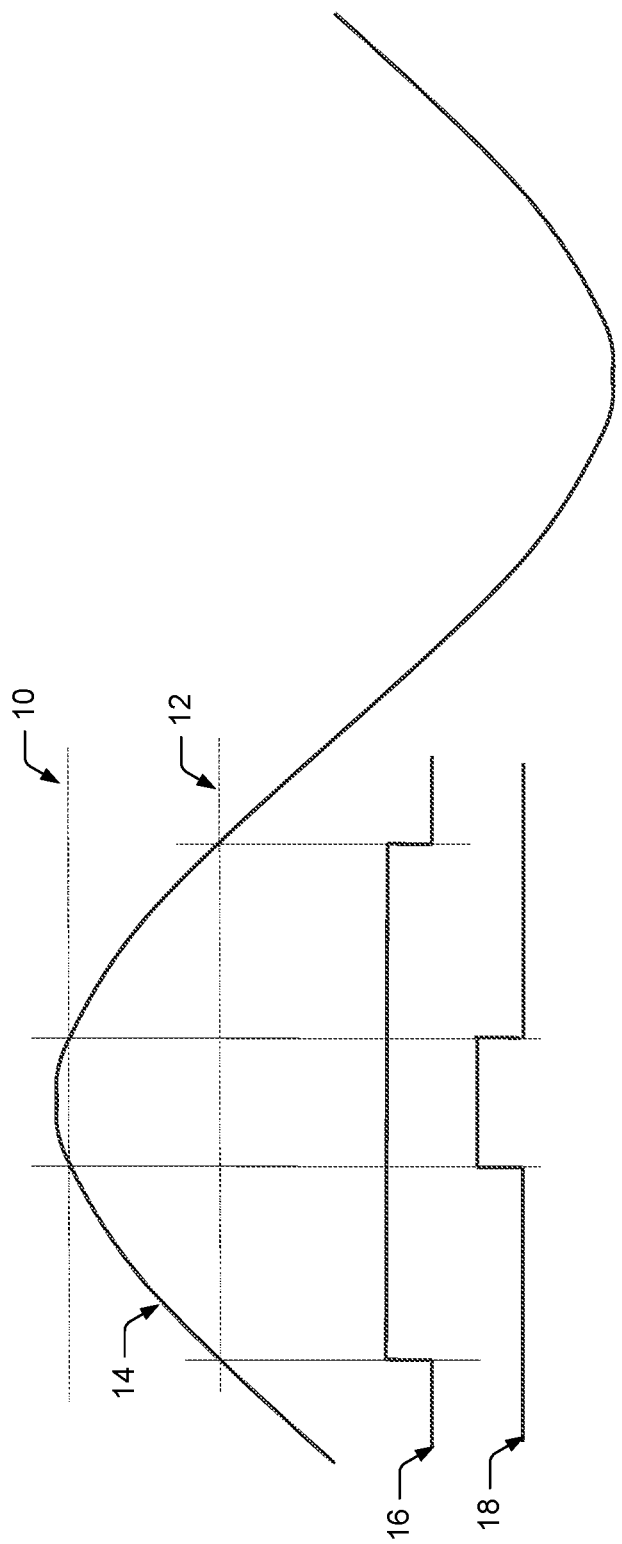
FIG. 1 (Prior Art) is a waveform illustrating functional characteristics of a conventional automatic gain control (AGC) circuit.

While the embodiments of AGC circuits and methods disclosed herein are susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the disclosure is intended to cover all modifications, equivalents and alternatives falling within the spirit and scope of the present disclosure as defined by the appended claims.

DETAILED DESCRIPTION OF PREFERRED EMBODIMENTS

Figure 2:
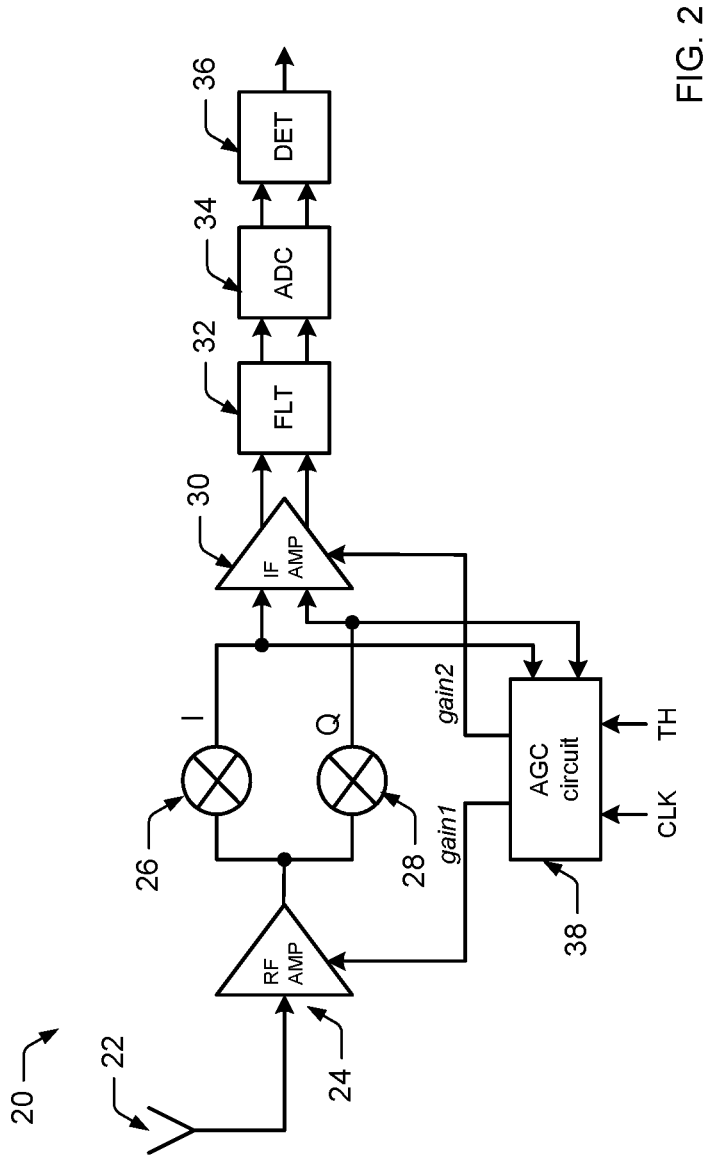
FIG. 2 is a block diagram of an exemplary receiver circuit including an AGC circuit in accordance with the present disclosure.

In general, the present disclosure is directed to automatic gain control (AGC) circuits and methods to control the gain step size of the gain adjustment provided by an AGC circuit, so as to reduce the AGC loop settling time. In particular, the present disclosure provides a fast AGC circuit that detects the duration of time that a received signal exceeds a threshold value, and controls the gain step size based on the detected time duration. According to one embodiment, an AGC circuit in accordance with the present disclosure may be included within a wireless receiver to adjust the gain of one or more amplifiers included within the receiver. An exemplary wireless receiver utilizing a phase quadrature demodulation scheme is illustrated in FIG. 2 and described in detail below. However, embodiments of the AGC circuits and methods described herein are not limited to use within wireless receivers, and may be used within any system or device where wide amplitude variations in the output signal could lead to a loss of information or unacceptable system performance.

FIG. 2 illustrates one embodiment of an exemplary wireless receiver 20 including an AGC circuit 40 in accordance with the present disclosure. In the embodiment shown in FIG. 2, a radio frequency (RF) signal received by antenna 22 is supplied to an RF amplifier 24, where it is amplified by a first gain amount (gain 1). Although not limited to such, RF amplifier 24 may be a low noise amplifier (LNA), or any other amplifier typically included in wireless receivers. Once amplified, the RF signal is supplied to a pair of mixers 26 and 28, which separate the amplified RF signal into intermediate frequency (IF) signals having in-phase (I) and quadrature phase (Q) components. The I and Q signals are generally equal in amplitude, but differ in phase by 90°. In order to maintain accurate amplitude and phase relationships between these signals, wireless receiver 20 includes similar analog circuitry in separate I and Q channels to process the I and Q signals.

In the embodiment shown in FIG. 2, the I and Q signals generated by mixers 26, 28 are supplied to an intermediate frequency (IF) amplifier 30, where they are amplified by a second gain amount (gain 2). Although not limited to such, IF amplifier 30 may be a programmable gain amplifier (PGA). Once amplified, the I and Q signals are separately filtered by filter 32, digitized by analog-to-digital converter (ADC) 34 and demodulated into digital data bits by detector 36. Although illustrated as singular blocks in FIG. 2, it is generally understood that separate IF amplifiers 30, filters 32, ADCs 34 and detectors 36 are included within the receiver to separately process the signals in the I and Q channels.

In some cases, the amplitude of the RF signal received by antenna 22 may vary over a wide dynamic range, and such variance may adversely affect receiver performance. For example, received RF signals with amplitudes that are too high or too low may not be accurately detected by wireless receiver 20, due to receiver saturation (when the RF signal amplitude is too high) or sensitivity limitations (when the RF signal amplitude is too low). For this reason, an automatic gain control (AGC) circuit 38 may be included in a feedback loop (or alternatively, in a feedforward loop) to compensate for variations in the received signal strength by adjusting the amount of gain (gain 1, gain 2) applied to the RF and IF signals by the RF and IF amplifiers 24 and 30.

In the illustrated embodiment, inputs of the AGC circuit 38 are coupled to receive the IF signals (i.e., I and Q signals) generated by mixers 26 and 28, while outputs of the AGC circuit are coupled to control the amount of gain respectively applied to the RF and IF signals by the RF and IF amplifiers 24 and 30. It should be understood that, while illustrated as such, the inputs of AGC circuit 38 are not limited to the output of mixers 26 and 28, and could be connected anywhere within the received signal path (e.g., anywhere between antenna input and detector 36) in alternative embodiments. In one preferred embodiment, the inputs to the AGC circuit 38 are the I and Q signals at the IF frequency (e.g. the output of the mixers 26 and 28, or the output of the IF amplifier 24) or the digital outputs of the ADCs 34. In an alternative embodiment, the AGC input may be limited to an input of one of the phases, e.g., either I signal or the Q signal. In addition to receiving IF signals, AGC circuit 38 is also coupled to receive a clock signal (CLK) and a threshold value (TH). As described in more detail below, the AGC circuit may use the clock signal and the threshold value to determine a duration of an overload condition, and to control the gain applied to the RF and IF signals by the RF and IF amplifiers 24 and 30 based on the detected duration.

In one embodiment, an AGC circuit in accordance with the present disclosure may generally include a peak detector, an integrator and a controller. The peak detector may be coupled to compare a received signal to a threshold value, and configured to detect an overload condition if the received signal exceeds the threshold value. The integrator may be coupled to the peak detector to detect a duration of the overload condition. The controller may be coupled to the integrator to control the gain of one or more amplifiers coupled to the AGC circuit based on the detected duration of the overload condition.

Conventional peak detectors utilize a higher threshold to detect signal levels close to an overload condition in a receiver circuit, and a lower threshold to establish a low gain condition. For example, when an interfering signal is received, a conventional AGC circuit may adjust the gain too low, compromising the receive sensitivity. The lower threshold used in conventional peak detectors will help to establish this low gain condition (so that the gain can be increased to optimize receiver sensitivity).

Unlike conventional peak detectors, the peak detector described herein uses a threshold value to detect and determine a duration for an overload condition in the system or device including the AGC circuit. As used herein, an "overload condition" may occur when the received signal strength approaches a critical level in the system or device including the AGC circuit where system or device performance may be affected. In a wireless receiver, for example, an overload condition may occur when the received signal strength comes close to saturating the receiver, such as for example exceeding the linear dynamic range for the ADC 34 thereby leading to clipping of the input signal.

Because an overload condition may occur during a positive and/or a negative peak in the received signal, the threshold value supplied to the peak detector to detect an overload condition may be a positive and/or a negative value. In order to detect an overload condition, however, an absolute value of the threshold value is preferably set close to, yet below, a value representing some critical level in the system. According to one embodiment, the threshold value may be set to a level that is lower than the clipping level of a wireless receiver minus the gain step of one or more amplifiers in the wireless receiver. For example, if RF amplifier 24 and IF amplifier 30 have a programmable gain in steps of 2 dB, then the threshold value may be set at least 2 dB lower than the clipping level of the wireless receiver to prevent oscillation of the AGC circuit. In one example, the threshold value may be set approximately 3 dB below a clipping level of a wireless receiver including the AGC circuit when the gain step of the RF and IF amplifiers are set to 2 dB. Alternative threshold values may be appropriate in other systems and devices, and/or may be based on other metrics of the system or device.

Figure 3:
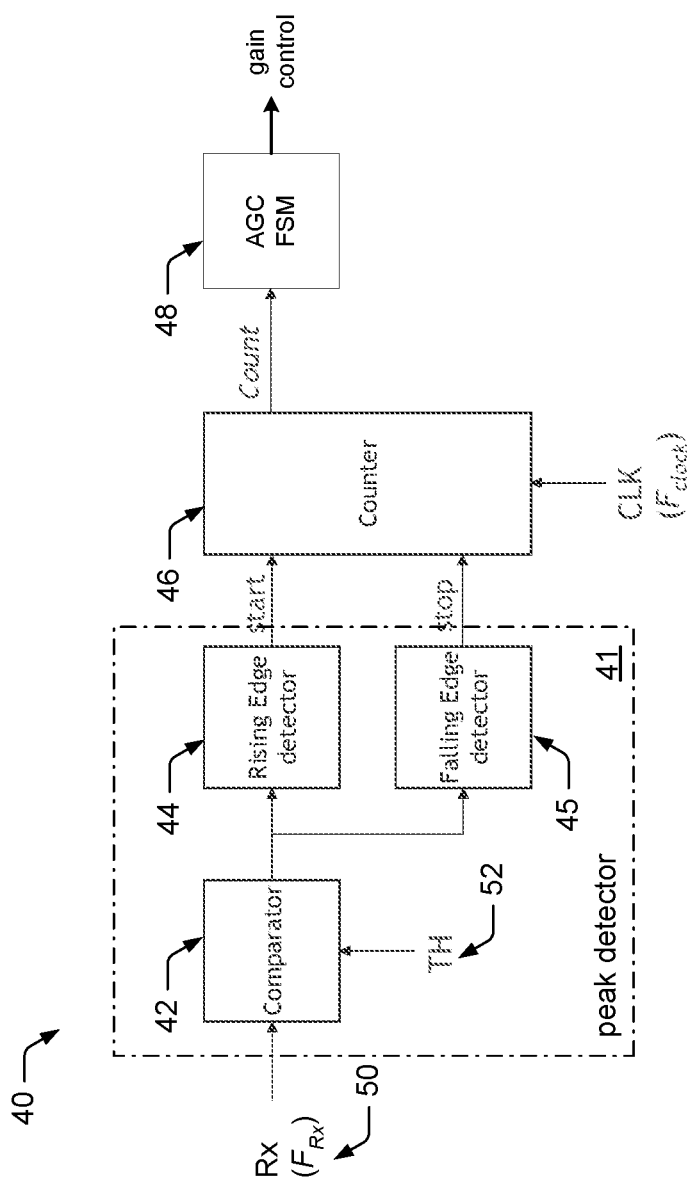
FIG. 3 is a block diagram illustrating one embodiment of an AGC circuit in accordance with the present disclosure.
Figure 4:
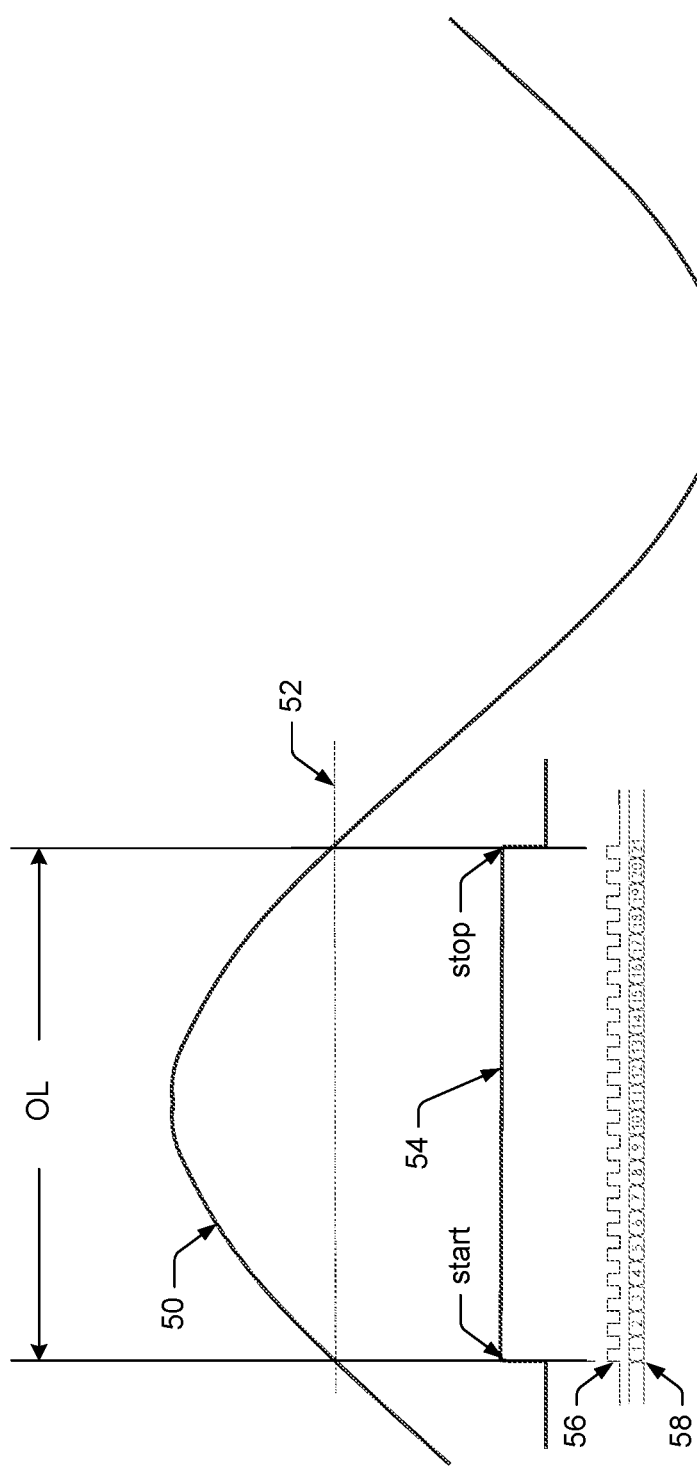
FIG. 4 is a waveform illustrating functional characteristics of the AGC circuit shown in FIG. 3.

FIG. 3 is a block diagram of an example embodiment of an AGC circuit 40 that may be configured to detect an overload condition in a received signal, determine a duration of the detected overload condition and control the amplifier gain based on the duration of the overload condition. Although not limited to such, AGC circuit 40 may be used in one embodiment to implement the AGC circuit 38 shown in FIG. 2 and described above. As noted above, an AGC circuit in accordance with the present disclosure, such as AGC circuit 40, may generally include a peak detector 41, an integrator (e.g., counter) 46 and a controller (e.g., AGC FSM) 48. FIG. 4 is a graph illustrating functional characteristics of the AGC circuit 40 shown in FIG. 3.

As noted above, a peak detector in accordance with the present disclosure may be generally configured to compare the amplitude of a received signal (Rx) to a threshold (TH) value, and to detect an overload condition if the amplitude of the received signal exceeds the threshold value. In the exemplary AGC circuit 40 illustrated in FIG. 3, a comparator 42, a rising edge detector 44 and a falling edge detector 45 are used to implement peak detector 41. However, other circuitry could also be implemented for the peak detector without departing from the scope of the present disclosure and while still taking advantage of the overload duration detection techniques described herein.

As shown in FIGS. 3 and 4, comparator 42 is coupled to receive a signal (Rx) 50 and configured to compare the received signal 50 to a threshold value (TH) 52. The comparator 42 then outputs a logic signal having one state if the received signal exceeds the threshold (TH) 52 and another state if the received signal does not exceed the threshold (TH) 52. According to one embodiment, comparator 42 may be implemented as a differential amplifier where the minus input is connected to the threshold value (TH) 52 and the plus input is connected to the received signal (RX) 50. When the received signal (RX) 50 exceeds the threshold value (TH) 52, then the output of the differential amplifier will approach the supply voltage. If the received signal (RX) 50 drops below the threshold value (TH) 52 then the output of the differential amplifier will approach 0 Volt. However, comparator 42 is not limited to this embodiment and may be alternatively implemented in other embodiments.

According to one example, received signal 50 may be one of the IF signals (i.e., the I signal or the Q signal) shown in FIG. 2 and described above. Alternatively, received signal 50 may be any other signal for which amplification has or will be performed in a wireless receiver (e.g., similar to wireless receiver 20), or in a completely different system or device. As noted above, peak detector 41 uses the threshold value (TH) 52 to detect an overload condition in the system or device including AGC circuit 40. In order to detect an overload condition, threshold value 52 may be set close to, yet below, some critical level in the system or device. In one example, threshold value (TH) 52 may be set approximately 3 dB below a clipping level of a wireless receiver including AGC circuit 40. Other threshold levels could also be used.

As shown in FIGS. 3 and 4, rising and falling edge detectors 44, 45 are configured to generate start and stop logic transitions for an integration (e.g., count) control signal 54, which may be used to start and stop a count 58 being incremented by counter 46. For the example embodiment depicted in FIG. 4, the control signal 54 effectively provides an enable pulse to the counter 46, and the counter increments its count 58 while the control signal 54 is at a high logic level. According to one embodiment, the rising and falling edge detectors 44, 45 may be implemented with logic circuitry. In one example, rising edge detector 44 may comprise an AND gate, where a first input of the AND gate is coupled to receive control signal 54 from comparator 42, and a second input of the AND gate is coupled to receive a delayed version of control signal 54. Similarly, falling edge detector 45 may comprise a NOR gate coupled to receive control signal 54 at a first input and a delayed version of control signal 54 at a second input of the NOR gate. In both the rising and falling edge detectors, the control signal 54 may be delayed by coupling one or more buffers between the output of comparator 42 and the second input of the AND/NOR gates. However, other circuitry could also be implemented for the edge detectors 44, 45 without departing from the scope of the present disclosure and while still taking advantage of the overload duration detection techniques described herein.

When received signal 50 exceeds threshold value 52, rising edge detector 44 is triggered to activate the count control signal or pulse 54 and start the count 58. When received signal 50 falls below threshold value 52, falling edge detector 45 is triggered to deactivate the count control signal or pulse 54 and stop the count 58. In this manner, the pulse 54 generated by the rising and falling edge detectors 44, 45 represents a duration of time that the received signal 50 exceeds threshold value 52. Because threshold value 52 is set to detect an overload condition in the system or device including the AGC circuit, the width of pulse 54, for the example embodiment depicted, also represents the duration of the overload (OL) condition.

As noted above, an integrator 46 in accordance with the present disclosure may be generally configured to detect the duration of the overload condition. In the illustrated embodiment, the integrator is implemented as a counter 46, which is coupled to receive the start and stop signals from edge detectors 44, 45, and to receive a clock signal (CLK) 56 from a clock signal source. Although specific examples of counters and clock signal sources are discussed below, the counter and clock signal source may be alternatively implemented without departing from the scope of the present disclosure. For example, instead of a gated counter, any type of time to digital converter may be used to implement the counter. Further, other types of integrators may also be used, in lieu of the counter shown in FIG. 3 and described herein, without departing from the scope of the present disclosure and while still taking advantage of the overload duration detection techniques described herein.

According to one embodiment, counter 46 may be a gated counter, and a crystal oscillator may be used to implement the clock signal source. In one example embodiment, counter 46 may include a count register and control logic that resets the count register and then increments the count in the count register each clock cycle between the start signal and the stop signal. For example, the control logic may include an SR flip-flop (e.g., a NOR gate latch) and an AND gate. In such an example, the start and stop signals from the edge detectors 44, 45 may be supplied to the inputs of the SR flip-flop. The output of the SR flip-flop may be supplied to one input of the AND gate, while the other input of the AND gate is coupled to receive the clock signal (CLK) 56 from the clock signal source. When the start signal is asserted, the AND gate will open and the clock periods will be counted (i.e., incremented) in the count register. When the stop signal is asserted, the AND gate closes and the count register contains a count value equal to the duration of the overload condition. Upon receiving the stop pulse, controller 48 reads the count value in the count register of counter 46 and resets the count register.

While pulse 54 is active, counter 46 counts the number of clock periods 56 that occur within the CLK signal to determine a duration of the pulse 54, and thus, a duration of the overload (OL) condition. In the particular example shown in FIG. 4, the duration of the overload condition is a final count 58 representing the number (e.g., 21) of clock periods 56 that the amplitude of the received signal 50 exceeds the threshold value 52. Because the count is dependent on the amplitude and frequency ($F_{Rx}$) of the received signal 50, as well as the threshold value 52 and clock frequency ($F_{clock}$) supplied to the AGC circuit 40, the final count value 58 will change with changes in these signals and values. When pulse 54 is deactivated (i.e., when the amplitude of received signal 50 drops below threshold value 52), counter 46 outputs the final count 58 to the controller, and resets the counter 46.

As noted above, a controller 48 in accordance with the present disclosure may be generally configured to control the amplifier gain based on the duration of the overload condition detected by the integrator/counter 46. In the illustrated embodiment, controller 48 is implemented as a finite state machine (AGC FSM) 48 that includes a plurality of logic steps that control one or more gain control signals output by the AGC circuit 40. According to one example, a hardware finite state machine, such as a Mealy or Moore FSM, may be used to implement the controller. However, other circuitry could also be implemented for the controller 48 without departing from the scope of the present disclosure and while still taking advantage of the overload duration detection techniques described herein. For example, a micro-controller unit (MCU) may be used in place of a finite state machine, in some embodiments. The MCU may use an interrupt at the stop signal generation to read the overload value (final count 58) in the count register of the integrator/counter 46.

As shown in FIG. 4, the AGC FSM 48 is coupled to receive the final count 58 from counter 46 and to output one or more gain control signals to one or more amplifiers based on the final count 58. As a non-limiting example, AGC FSM 48 may be coupled to provide a first gain control signal (gain 1) to the RF amplifier 24 and a second gain control signal (gain 2) to the IF amplifier 30 that are shown in the wireless receiver embodiment of FIG. 2 and described above. The first and second gain control signals (gain 1 and gain 2) supplied to amplifiers 24 and 30 may be substantially the same, or may be different, if different gain adjustments are needed to control the RF and IF amplification stages. Regardless of the number of amplifiers, the AGC FSM 48 may be generally configured to control the amplifier gain(s), and the gain step size(s), of the receive path circuitry based on the duration of the overload condition specified by the final count 58.

Because of process spread in the analog circuitry, the threshold value 52 and the saturation levels of the receiver circuitry may vary, which may require calibration of the threshold value 52 and/or count values. Different count values may be converted into overload condition values ($OL_{dB}$) expressed in decibels. According to one embodiment, an equation may be used to convert a range of overload condition values ($OL_{dB}$) expressed in decibels into corresponding count values expressed in clock periods. Referring to FIG. 4, each count value may represent a number of clock periods 56 that occur during an overload (OL) condition. An example of an equation that may be used to convert overload condition values ($OL_{dB}$) into count values (count) is shown below.

$$\text{count} = \frac{F_{CLK}}{F_{RX}} \left[ \frac{1}{2} - \frac{1}{\pi} \sin^{-1}(10^{-OL_{dB}/20}) \right], \quad \text{EQ. 1}$$

In EQ. 1, $F_{CLK}$ is the frequency of the CLK signal supplied to counter 46 that is used to generate the count value (count); $F_{Rx}$ is the frequency of the received signal 50; and $OL_{dB}$ is the overload condition value (expressed in decibels) corresponding to the amount that the amplitude of the received signal 50 exceeds the threshold value 52.

Figure 6:
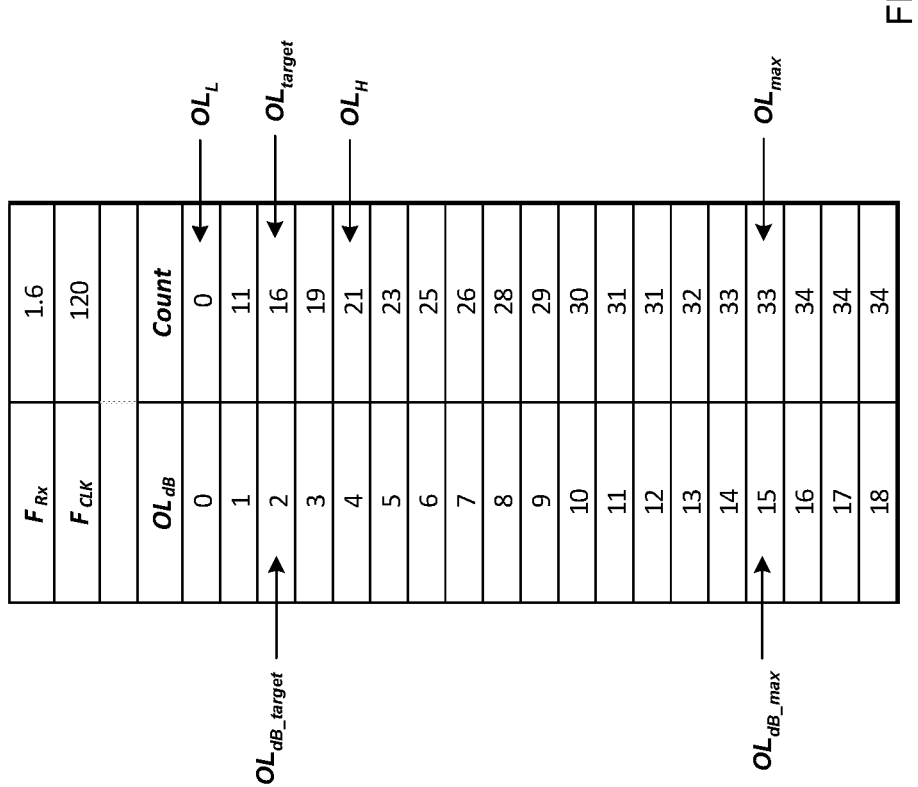
FIG. 6 illustrates an exemplary table of look-up values that may be stored in memory and used to control the gain and the gain step size.

According to one embodiment, EQ. 1 may be used to generate a look-up table relating count values (count) to corresponding overload condition values expressed in decibels ($OL_{dB}$) for a particular CLK signal frequency ($F_{CLK}$) and a particular frequency ($F_{Rx}$) of the received signal 50. The look-up table can be stored in memory and used by the AGC FSM 48, as described in more detail below. In one example, a look-up table relating count values to corresponding overload condition values may be generated for an $F_{CLK}$ of 120 MHz and an $F_{Rx}$ of 1.6 MHz, as shown in FIG. 6 and described in more detail below. However, the look-up table disclosed herein is not limited to any particular frequency of CLK signal or any particular frequency of received signal. In one embodiment, a plurality of look-up tables relating count values to corresponding overload condition values may be generated and stored in memory for multiple CLK signal frequencies and/or multiple received signal frequencies. Such an embodiment would enable the AGC circuit 40 to detect overload conditions for different received signal frequencies ($F_{Rx}$).

During use, the AGC FSM 48 may use the look-up table(s) to convert the final count 58 received from counter 46 into a corresponding overload condition value ($OL_{dB}$), which can be used to control the amplifier gain(s). Unlike conventional AGC circuits, which typically adjust the gain up/down by a small fixed amount or gain step (e.g., fixed +/−3 dB), AGC FSM 48 is configured to control the gain, and the gain step size, based on the duration/severity of the detected overload condition. For example, larger count values 58 representing longer overload durations may lead the AGC FSM 48 to reduce the gain using larger gain steps, while smaller count values 58 representing shorter overload durations may lead the AGC FSM 48 to reduce the gain in smaller gain steps, or to not adjust the gain at all.

Figure 5:
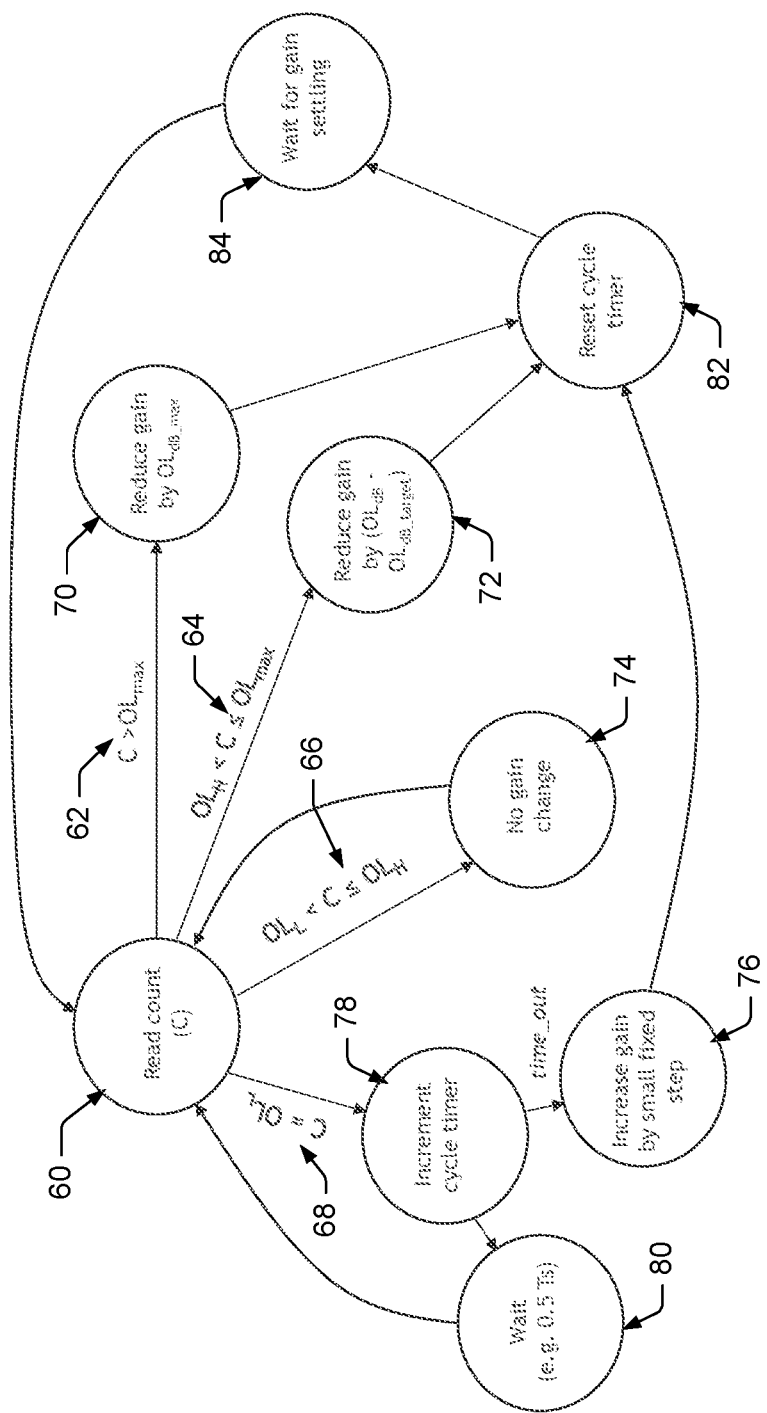
FIG. 5 is a state diagram illustrating an exemplary method of gain control in accordance with the present disclosure.

FIG. 5 is an exemplary state diagram illustrating one manner or method in which the AGC FSM 48 may use the final count 58 to control the amplifier gain, and the gain step size, based on the duration/severity of the detected overload condition. As shown in FIG. 5, AGC FSM 48 may read the final count 58 received from counter 46 (in step 60), compare the read count (C) to different ranges of count values representing different overload conditions (in steps 62, 64, 66 and 68) and control the amplifier gain and the gain step size based on the comparison results (in steps 70, 72, 74 and 76). Similar to the final count 58, the count values representing different overload conditions may be expressed as a number of clock periods of the CLK signal supplied to counter 46. These count values may be determined, for example, using EQ. 1 or the table(s) of look-up values stored in memory.

FIG. 6 illustrates one embodiment of an exemplary look-up table relating count values (Count) to corresponding overload condition values ($OL_{dB}$) expressed in decibels for a CLK signal frequency ($F_{CLK}$) of 120 MHz and a received signal frequency ($F_{Rx}$) of 1.6 MHz. As noted above, the look-up table is not limited to any particular frequency of CLK signal or any particular frequency of received signal. As such, the count values and overload condition values shown in FIG. 6 are provided as examples only.

From the overload condition values ($OL_{dB}$) and count values (Count) stored within the look-up table, ranges of count values representing different overload conditions can be specified. For example, the count values stored within the look-up table may be used to specify a first range of count values representing a maximum overload condition. To determine the first range, it may first be necessary to determine a maximum count value ($OL_{max}$) for which an overload duration can be accurately detected. In one embodiment, the maximum count value may be determined from the look-up table, and may be generally dependent on the frequency of the CLK signal and the frequency of the received signal specified therein.

In the exemplary look-up table shown in FIG. 6, overload durations can be accurately detected up to a maximum count value ($OL_{max}$) of 33 clock periods, which corresponds to a maximum overload duration ($OL_{dB\_max}$) of 15 dB. Beyond this point, further increases in dB do not produce integral increases in clock periods. If the final count 58 falls within a first range of count values that exceeds the maximum count value, $OL_{max}$, the AGC FSM 48 may reduce the amplifier gain by an amount (e.g., 15 db) that matches the maximum overload duration ($OL_{dB\_max}$).

Once a maximum count value ($OL_{max}$) is determined, a second range of count values representing a medium overload condition may be specified for count values greater than a high count value ($OL_H$), but less than or equal to the maximum count value ($OL_{max}$). As noted below, the high count value ($OL_H$) may be an upper extremity for which no gain adjustments are made. Within this second range of count values, the AGC FSM 48 may reduce the amplifier gain by a gain step size proportional to the current overload duration ($OL_{dB}$). In one example, the amplifier gain may be reduced by [$OL_{dB}-OL_{dB\_target}$], where $OL_{dB\_target}$ is a target overload condition value expressed in decibels.

According to one embodiment, the target overload condition value ($OL_{dB\_target}$) may be determined from the look-up table by dividing the maximum count value ($OL_{max}$) in half to determine a target count value ($OL_{target}$), and converting the target count value ($OL_{target}$) into a target overload condition value ($OL_{dB\_target}$) expressed in decibels. In the exemplary look-up table shown in FIG. 6, for example, the maximum count value ($OL_{max}$) is 33 clock periods. In this example, one-half of the maximum count value (e.g., 33/2≈16 clock periods) corresponds to a target overload duration ($OL_{dB\_target}$) of 2 dB. By subtracting the target overload duration ($OL_{dB\_target}$) from the current overload duration ($OL_{dB}$), a gain step size proportional to the current overload duration may be used to reduce the amplifier gain when the count value falls within the second range of count values.

In some cases, AGC FSM 48 may determine that no gain adjustments are needed if the final count 58 falls within a third range of count values representing a minimum overload condition. According to one embodiment, it may be determined that no gain adjustments are needed for relatively small overload durations, such as those ranging between about 0 dB and about 4 dB. In the exemplary look-up table shown in FIG. 6, overload durations within this range correspond to count values ranging between 0 clock periods and 21 clock periods. In such an example, the third range of count values may include count values greater than a low count value ($OL_L$) of zero (0) clock periods, but less than or equal to a high count value ($OL_H$) of twenty-one (21) clock periods. If the final count 58 falls within this range, the AGC FSM 48 may determine that no gain adjustments are needed and the amplifier gain may be maintained.

Returning to the state diagram shown in FIG. 5, AGC FSM 48 reads or receives the count (C) from the counter 46 and compares it to different ranges of count values representing different overload conditions (such as a maximum overload condition, a medium overload condition and a minimum overload condition, as discussed above), and adjusts the gain and the gain step size, accordingly. For example, if the count (C) exceeds a maximum count value (e.g., an $OL_{max}$ of 33 clock periods) in step 62, AGC FSM 48 may reduce the gain by a maximum gain step (e.g., an $OL_{dB\_max}$ of 15 dB) in step 70. If the count (C) is greater than the high count value (e.g., $OL_H$ of 21 clock periods), but less than or equal to the maximum count value ($OL_{max}$) in step 64, AGC FSM 48 may reduce the gain by a gain step size proportional to the overload duration ($OL_{dB}$) in step 72. In one example, AGC FSM 48 may reduce the gain by a gain step size equal to ($OL_{dB}$-$OL_{dB\_target}$), as discussed above. Finally, if the count (C) is greater than the low count value (e.g., $OL_L$ of 0 clock periods), but less than or equal to the high count value (e.g., $OL_H$ of 21 clock periods) in step 66, AGC FSM 48 may determine that no gain adjustments are needed in step 74.

In some cases, the count (C) may be equal to the low count value (e.g., $OL_L$ of 0 clock periods) in step 68, indicating that the received signal strength is below the threshold (TH) 52. If the receive signal stays below this threshold (TH) 52 for a predetermined period of time, the AGC FSM 48 can be configured to increase the amplifier gain by a small gain step size (e.g., +3 dB) in step 76. For the example embodiment shown, a cycle timer is incremented in step 78 to determine how long the received signal stays below the threshold (TH) 52. For example, if the count (C) is determined to be equal to the low count value (e.g., $OL_L$ of 0 clock periods) in step 68, effectively representing that the received signal is below the threshold (TH) 52, AGC FSM 48 may increment the cycle timer in step 78, wait for a short duration of time (e.g., half a symbol period, Ts) in step 80, and read the count (C) again in step 60. If the cycle timer times out (time_out), the gain may be increased by a small gain step size (e.g., +3 dB) in step 76. In this way the AGC will exhibit a fast attack (gain reduction) and slow decay (gain increase) which is often desired to mitigate gain chattering. Once the gain is increased in step 76, the cycle timer is reset in step 82, and the AGC FSM 48 waits for the gain to settle in step 84 before re-reading the count in step 60. As shown in FIG. 5, the AGC FSM 48 may also reset the cycle timer in step 82 and wait for the gain to settle in step 84 after the gain is reduced in steps 70 and 72.

The embodiments of automatic gain control circuits and methods shown in FIGS. 3-5 and described above improve upon conventional AGC circuits and methods by controlling the amplifier gain, and the gain step size, based on a duration of a detected overload condition. By adjusting the gain by an amount based on the overload duration, the AGC circuit and method described herein reduce settling delay in the AGC loop, while improving the stability and hence prolonging the length of usable preamble symbols for demodulation. Having more preamble symbols available for demodulation may improve the receiver performance and robustness by, e.g., improving accuracy of the Automatic Frequency Compensation (AFC), improving preamble detection (less false detections, and higher sensitivity for valid preambles) and improving receive sensitivity by improved preamble detection. Having more preamble symbols available for demodulation is particularly helpful when the preamble is short to start with, e.g., as in Bluetooth Low Energy, where the preamble is only 8 symbols long. In some embodiments, the AGC loop may settle in as little as one step. If relatively large signals are received by the system, the AGC circuit and method described herein enables the amplifier gain to be reduced using large gain step sizes (e.g., −15 dB) without risking overshoot. This avoids the undesirable ringing typically produced in conventional AGC circuits that use the trial-and-error approach to control gain.

In the embodiments illustrated in FIGS. 3-5, only one received signal 50 is processed by the AGC circuit 40 at a time. As noted above, received signal 50 may be one of the IF signals (e.g., the I signal or the Q signal) generated within the wireless receiver 20 shown in FIG. 2. If utilized within wireless receiver 20, AGC circuit 40 may be used to control the gain (gain 1, gain 2) applied to the RF and IF amplifiers 24 and 30 based on the amount of time the I signal exceeds threshold 52, the amount of time the Q signal exceeds threshold 52, or some combination thereof. In some embodiments, the I and Q signals may be processed by AGC circuit 40 in series, one after the other, to generate the gain control signals (gain 1, gain 2). In other embodiments, however, it may be desirable to process the I and Q signals concurrently, or in parallel. Embodiments of such are illustrated in FIGS. 7-10 and described in more detail below.

Figure 7:
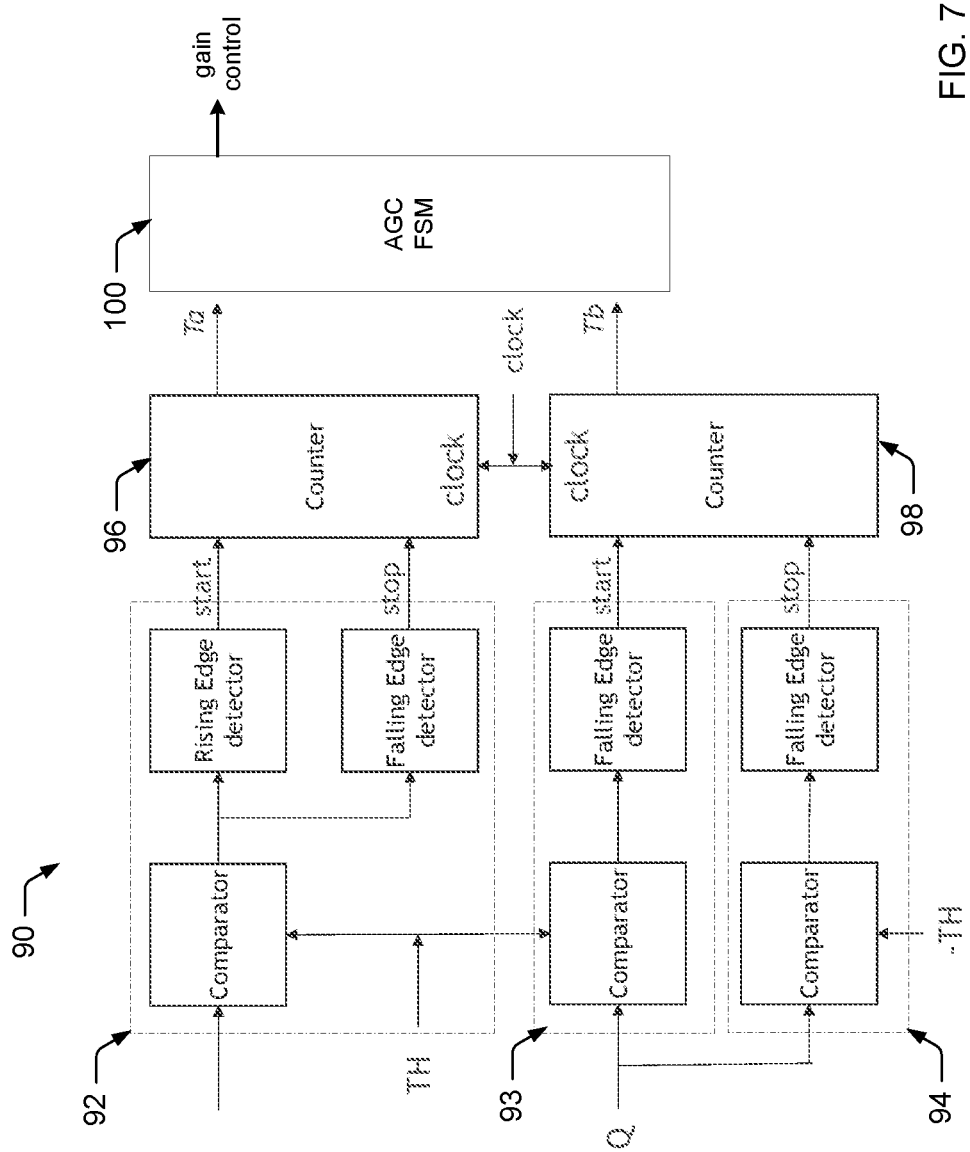
FIG. 7 is a block diagram illustrating another embodiment of an AGC circuit in accordance with the present disclosure.
Figure 8:
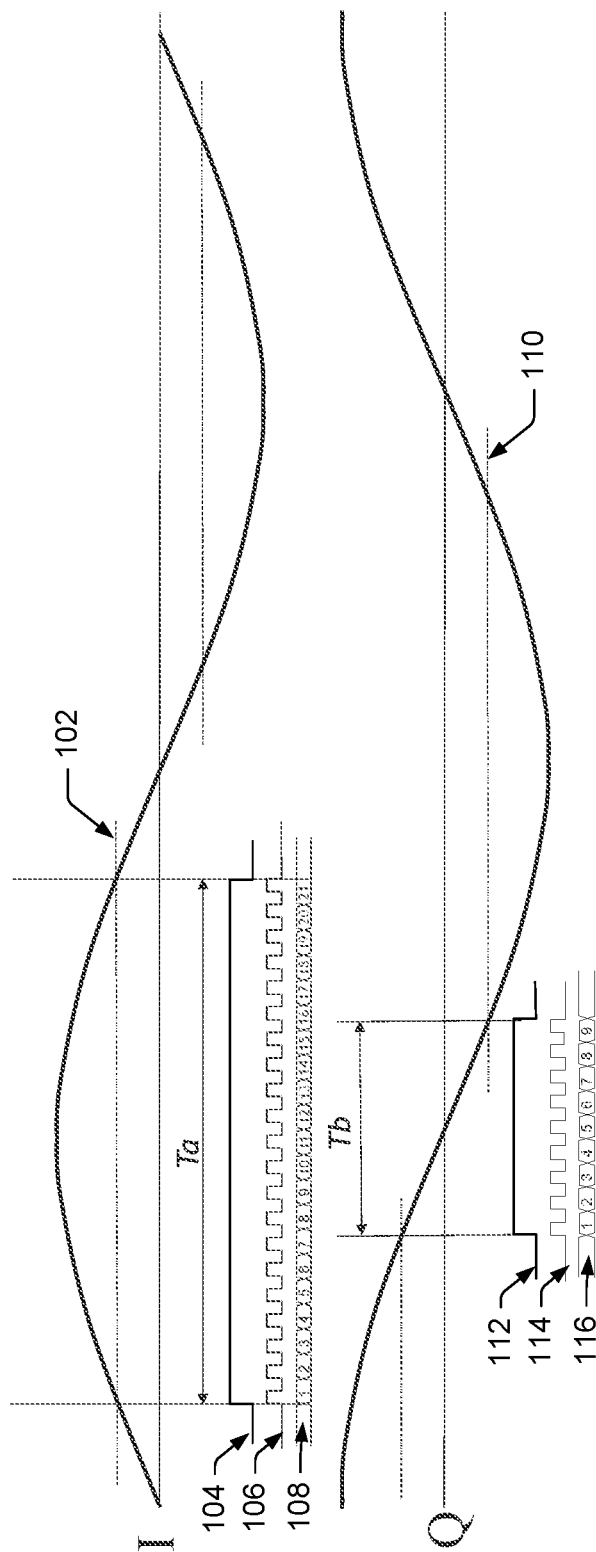
FIG. 8 is a waveform illustrating functional characteristics of the AGC circuit shown in FIG. 7.

FIG. 7 is a block diagram illustrating another AGC circuit 90 in accordance with the present disclosure that may be configured to detect an overload condition in a received signal, determine a duration of the overload condition, and control the amplifier gain and the gain step size based on the detected duration of the overload condition. Although not limited to such, AGC circuit 90 may be used in one embodiment to implement the AGC circuit 38 shown in FIG. 2 and described above. FIG. 8 is a graph illustrating functional characteristics of the AGC circuit 90 shown in FIG. 7.

In some embodiments, the duration of an overload condition may alternatively be determined based on the duration of time (Ta) that a received signal exceeds a threshold value (i.e., an overload duration), and the duration of time (Tb) that the received signal does not exceed the threshold value (i.e., a non-overload duration). In the example shown in FIG. 8, the duration of the overload condition may be determined using EQ. 2:

$$\text{Count Ratio} = \frac{Ta}{Ta + Tb} \qquad \text{EQ. 2}$$

In EQ. 2, the Count Ratio represents the overload condition and may be expressed in a ratio of CLK pulses; Ta is the number of CLK pulses that occur while the I (or Q) signal exceeds a positive threshold value 102; and Tb is the number of CLK pulses that occur when the Q (or I) signal falls below the positive threshold value 102, but does not exceed a corresponding negative threshold value 110 (see, FIG. 8). According to one preferred embodiment, Ta is measured on the I signal and Tb is measured on the Q signal (or vice versa), so that the Count Ratio can be extracted in only one half of the IF period which will help to reduce the AGC response time. Alternatively, the Q signal may be used to measure Ta and the I signal may be used to measure Tb. Further, the I signal can be used to measure both Ta and Tb, and the Q signal can be used to measure both Ta and Tb. Regardless of which I/Q signal is used to generate the Count Ratio value, the Count Ratio value determined in EQ. 2 may be used by the controller to control the amplifier gain, and the gain step size, as described in more detail below. It is further noted that Ta and Tb may be derived from any other integrator function that determines the length of Ta and Tb, and that integration using a counter is just one example.

In the embodiment shown in FIGS. 7 and 8, the Count Ratio normalizes the overload conditions to the received signal (e.g., IF signal) frequency. In other words, (Ta+Tb) is one-half the received signal period and Ta is the fraction of that representing the duration of the overload condition. This provides the advantage of determining the overload duration independent from the received signal (e.g., IF signal) frequency, and is particularly helpful in the case of adjacent channel interference (e.g., in the case that the interferer may be forcing a different frequency in the IF). For example, if the desired IF frequency is 1.6 MHz then the desired channel will cause a frequency of 1.6 MHz in the IF signal path (after the mixers 26 and 28). However, if there is a strong interferer at 1 MHz from the desired frequency, the frequency in the IF signal path may be 1 MHz below or above the desired IF frequency (e.g., 600 kHz or 2.6 MHz). When the peak detector shown in FIG. 3 is used, the detected overload duration (OL) is also a function of this frequency. For example, for the same overload condition, a larger count value (C) may be determined when a 600 kHz frequency is present in the IF signal path, or a smaller count value (C) may be determined when a 2.6 MHz frequency is present in the IF signal path. When the peak detector of FIG. 7 is used, the overload duration is normalized to the frequency in the IF signal path, which makes it independent of the frequency in the IF signal path and avoid errors in the count value.

As with the previously described embodiment, the AGC circuit embodiment shown in FIG. 7 may generally include peak detectors, integrators (e.g., counter), and a controller (e.g., FSM) to control the gain, and the gain step size, of one or more amplifiers (e.g., RF and IF amplifiers 24 and 30) coupled to outputs of the AGC circuit 38/90. In order to concurrently process the I and Q signals, however, AGC circuit 90 includes three peak detectors 92, 93, 94 and a pair of integrators 96, 98, which are coupled to the controller 100. In some embodiments, the peak detectors 92, 93, 94, the integrators 96, 98 and the controller 100 may be implemented as described above in the AGC circuit embodiment shown in FIG. 3. For example, peak detectors 92, 93, 94 may each include a comparator followed by one or more edge detectors, integrators 96 and 98 may each be implemented with gated counters or other time to digital converters, and a finite state machine (FSM) may be used to implement the controller 100. However, the peak detectors, integrators and controller shown in FIG. 7 may be alternatively implemented without departing from the scope of the present disclosure and while still taking advantage of the overload duration detection techniques described herein.

In the embodiment shown in FIG. 7, peak detectors 92, 93, 94 are coupled to receive the I and Q signals concurrently, and configured to compare the received IF signal to a threshold (TH) value. As shown in FIG. 8 and noted above, the threshold value may be a positive value (+TH) 102 and a negative value (−TH) 110. It is also noted that a magnitude detector can be used to detect the absolute value of the magnitude of the received signal, and this magnitude can be compared to a threshold value (TH). When the amplitude of the I signal exceeds the positive threshold value 102, a rising edge detector within peak detector 92 is triggered to activate a first pulse 104 by supplying a start signal to counter 96. When the amplitude of the I signal falls below positive threshold value 102, a falling edge detector within peak detector 92 is triggered to deactivate the first pulse 104 by supplying a stop signal to counter 96. While the first pulse 104 is active, counter 96 counts the number of clock periods 106 in the CLK signal supplied to the counter to generate a final count 108 (e.g., 21) representing the duration of time (Ta) that the received IF signal exceeds the threshold value. Because the Q signal is phase shifted 90° from the I signal, the duration of time (Tb) that the received IF signal does not exceed the threshold value can be measured concurrently, or in parallel, with the Ta measurement.

During the Ta measurement, for example, a falling edge detector within peak detector 93 may be triggered when the amplitude of the Q signal falls below the positive threshold value 102. When this occurs, a second pulse 112 is activated when a start signal is supplied to counter 98. When the amplitude of the Q signal exceeds the negative threshold value 110, a falling edge detector within peak detector 94 is triggered to deactivate the second pulse 112 by supplying a stop signal to counter 98. While the second pulse 112 is active, counter 98 counts the number of clock periods 114 in the CLK signal supplied to the counter to generate a final count 116 (e.g., 9) representing the duration of time (Tb) that the received IF signal does not exceed the threshold value.

The Ta and Tb measurements generated by counters 96, 98 are supplied to AGC FSM 100, where the measurements are used to generate a Count Ratio value according to EQ. 2 above. As noted above, the Count Ratio value represents the ratio of the overload condition to half an IF period and is expressed as a ratio of CLK pulses. Similar to the previously described count value, the AGC FSM 100 shown in FIG. 7 may use the Count Ratio value specified by EQ. 2 to control the amplifier gain, and the gain step size, based on the duration/severity of the detected overload condition. This may be achieved, in one embodiment, by using a state machine and a table of look-up values, similar to those shown in FIGS. 5 and 6 and discussed above. However, instead of storing Count values in the look-up table of FIG. 6 and comparing such count (C) values to different overload condition values as shown in the state diagram of FIG. 5, the present embodiment may store a plurality of Count Ratio values generated according to EQ. 2 in a look-up table relating Count Ratio values to overload condition values expressed in decibels ($OL_{dB}$).

Subsequently, AGC FSM 100 may use a Count Ratio calculated during operation to control the amplifier gain, and the gain step size, based on the duration/severity of the detected overload condition. For example, AGC FSM 100 may read the Ta and Tb measurements generated by counters 96, 98, calculate the corresponding Count Ratio according to EQ. 2, compare the calculated Count Ratio to different ranges of Count Ratio values representing different overload conditions (e.g., a maximum overload condition, a medium overload condition, a minimum overload condition, and a no overload condition) and control the amplifier gain and the gain step size based on the comparison results, similar to that shown in FIG. 5 and described above. For example, AGC FSM 100 may reduce the gain by a maximum gain step size, if the Count Ratio falls within a first range of Count Ratio values representing a maximum overload condition, reduce the gain by a proportional gain step size, if the Count Ratio falls within a second range of Count Ratio values representing a medium overload condition, maintain the gain, if the Count Ratio falls within a third range of Count Ratio values representing a minimum overload condition, and increase the gain by a small gain step size, if the Count Ratio is below the third range of Count Ratio values. The first, second and third range of Count Ratio values may be determined in a manner similar to that described above.

Similar to the embodiment shown in FIG. 3, the AGC circuit embodiment shown in FIG. 7 improves upon conventional AGC circuits and methods by controlling the amplifier gain, and the gain step size, based on a duration of a detected overload condition. By adjusting the gain by an amount based on the overload duration, AGC circuit 90 of FIG. 7 reduces settling delay in the AGC loop, enables large gain steps to be used to reduce amplifier gain without risking overshoot, and avoids corrupting the demodulated signal. In addition to these advantages, the AGC circuit embodiment of FIG. 7 improves upon the AGC circuit embodiment of FIG. 3 by enabling the overload duration to be measured in one-half of the received signal period by using the I and/or Q signals to generate concurrent Ta and Tb measurements. This enables AGC circuit 90 of FIG. 7 to determine a Count Ratio (e.g., [Ta/(Ta+Tb)]) that allows for more accurate assessment of overload duration when high energy interferers are present in the received signal along with the desired transmission.

Figure 9:
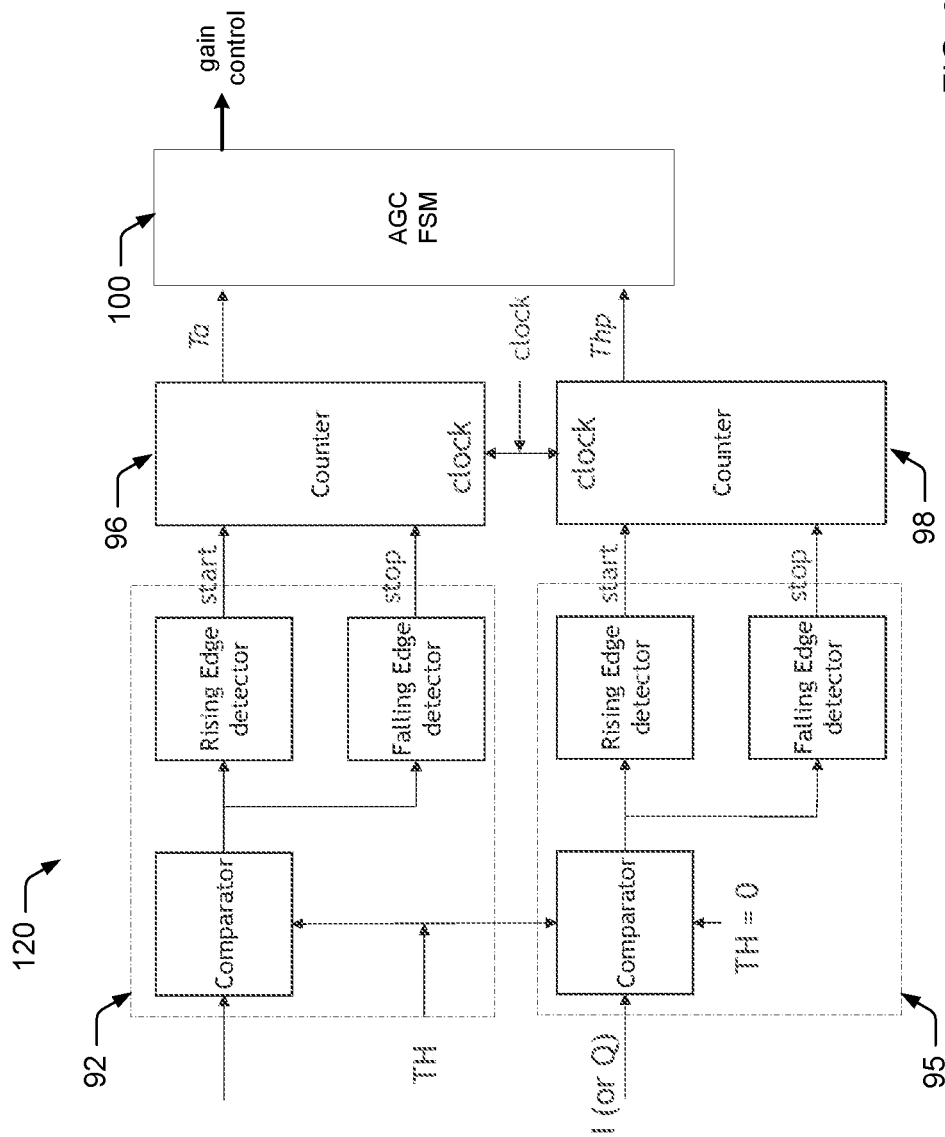
FIG. 9 is a block diagram illustrating another embodiment of an AGC circuit in accordance with the present disclosure.
Figure 10:
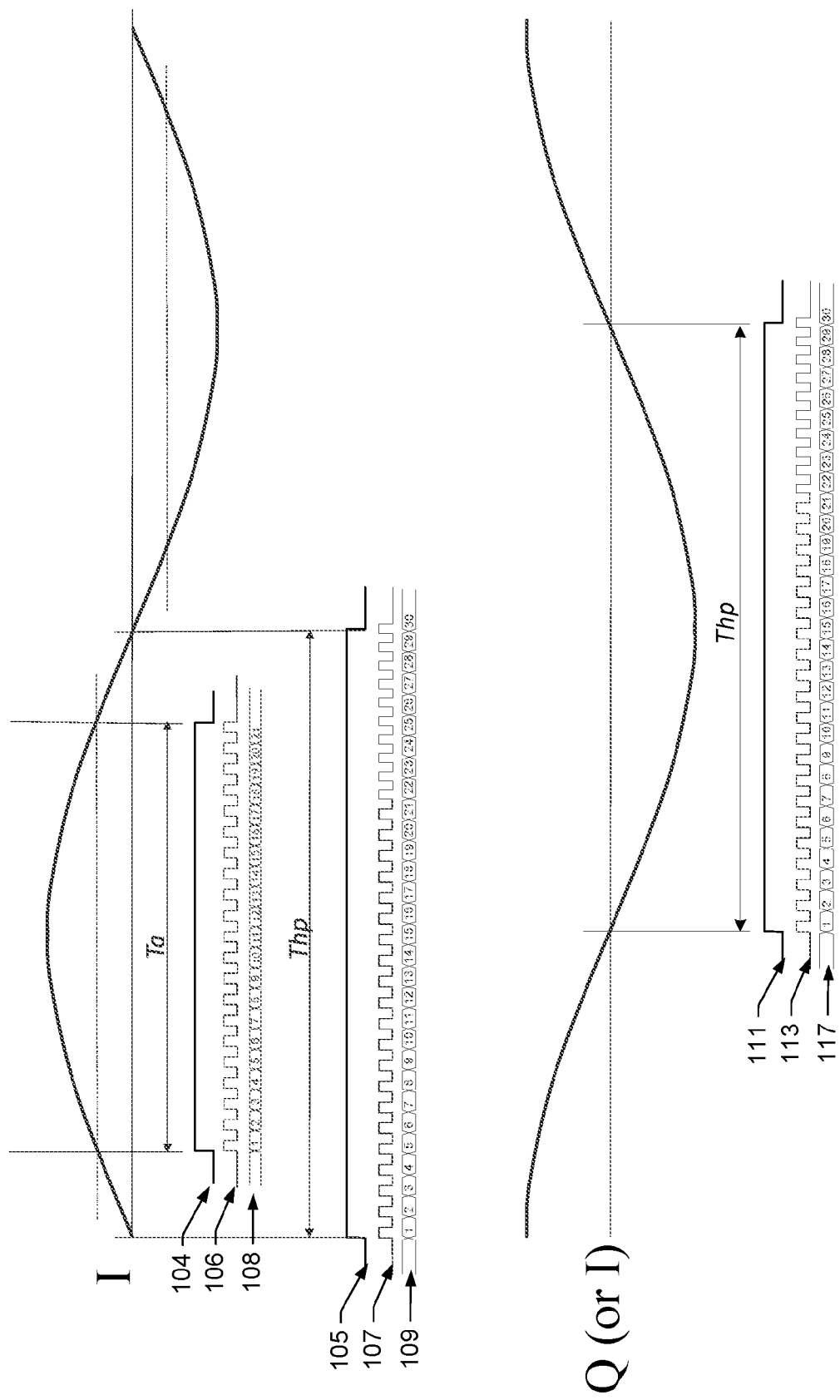
FIG. 10 is a waveform illustrating functional characteristics of the AGC circuit shown in FIG. 9.

FIG. 9 is a block diagram illustrating yet another AGC circuit 120 in accordance with the present disclosure that may be configured to detect an overload condition in a received signal, determine a duration of the overload condition, and control the amplifier gain and the gain step size based on the detected duration of the overload condition. Although not limited to such, AGC circuit 120 may be used in one embodiment to implement the AGC circuit 38 shown in FIG. 2 and described above. FIG. 10 is a graph illustrating functional characteristics of the AGC circuit 120 shown in FIG. 9.

Similar to the AGC circuit 90 shown in FIG. 7, the AGC circuit 120 shown in FIG. 9 may be used to normalize the overload duration to the frequency of the received signal (e.g., the IF signal), therefore avoiding errors in the Count Ratio values used to determine the overload duration. Instead of calculating a Count Ratio based on Ta (i.e., an overload duration) and Tb (i.e., non-overload duration) measurements according to EQ. 2 above, the AGC circuit 120 embodiment shown in FIG. 9 generates a Count Ratio according to:

$$\text{Count Ratio} = \frac{Ta}{Thp} \quad \text{EQ. 3}$$

In EQ. 3, the Count Ratio represents the overload condition expressed as a ratio of CLK pulses; Ta is the number of CLK pulses that occur while the received signal (I or Q) exceeds a positive threshold value 102; and Thp is the number of CLK pulses that occur while the received signal (I or Q) exceeds (or alternatively is below) a threshold value of zero (see, FIG. 10).

In some embodiments, the Count Ratio can be extracted in one-half of the received signal period and the AGC response time can be reduced by obtaining the Ta and Thp measurements on the I signal, or alternatively, on the Q signal. Alternatively, the I signal (or the Q signal) may be used to measure Ta and the Q signal (or the I signal) may be used to measure Thp. In some embodiments, the settling speed of the AGC circuit may be further increased by measuring Ta and Thp during positive and negative phases of both the I and Q signals. In some embodiments, several Ta and Thp measurements obtained from a combination of phases on the I and Q signals may be combined to filter out noise and interference. Regardless of how the Count Ratio value is obtained, the Count Ratio value determined in EQ. 3 may be used by the controller to control the amplifier gain, and the gain step size, as described in more detail below.

The AGC circuit 120 shown in FIG. 9 is similar to the AGC circuit 90 shown in FIG. 7, and includes many of the same components. For instance, AGC circuit 120 includes peak detector 92, integrators/counters 96 and 98 and AGC FSM 100, which are also included within AGC circuit 90. As shown in FIGS. 7-10, peak detector 92 compares the amplitude of the received signal (e.g., the I signal or the Q signal) to a positive threshold (+TH) value 102, and activates a pulse 104 while the amplitude of the received signal exceeds the positive threshold value 102. Counter 96 counts the number of clock periods 106 in the CLK signal supplied to the counter to generate a final count 108 (e.g., 21) representing the duration of time (Ta) that the received signal exceeds the positive threshold value 102. The Ta measurement generated by the counter 96 may then be supplied to AGC FSM 100 for calculating the Count Ratio value according to EQ. 3.

Unlike the embodiment shown in FIG. 7, which includes a pair of peak detectors 93 and 94 for detecting a duration (Tb) of a non-overload condition, the ACG circuit 120 shown in FIG. 9 includes a peak detector 95 for determining a duration (Thp) of the received signal half period. As shown in the embodiment of FIGS. 9 and 10, for example, peak detector 95 may include a comparator to compare the amplitude of the received signal (I or Q) to a zero threshold value (TH), a rising edge detector to activate a pulse 105 (by supplying a start signal to counter 98) when the amplitude of the I signal (or the Q signal) exceeds the zero threshold value, and a falling edge detector to deactivate the pulse 105 (by supplying a stop signal to counter 96) when the amplitude of the I signal falls below the zero threshold value. Alternatively, peak detector 95 may activate a pulse 111 for the duration in which the amplitude of the Q signal (or the I signal) falls below the zero threshold value when measuring Thp on negative phases of the Q (or the I) signal. While the pulse (105 or 111) is active, counter 98 counts the number of clock periods (107 or 113) in the CLK signal supplied to the counter to generate a final count (109 or 117) (e.g., 30) representing the duration (Thp) of the received signal half period. The Thp measurement generated by counter 98 may then be supplied to AGC FSM 100 for calculating the Count Ratio value according to EQ. 3.

Like the previous embodiment, the AGC FSM 100 shown in FIG. 9 may use the Count Ratio value specified by EQ. 3 to control the amplifier gain, and the gain step size, based on the duration/severity of the detected overload condition. This may be achieved, in one embodiment, by using a state machine and a table of look-up values, similar to those shown in FIGS. 5 and 6 and discussed above. For example, a plurality of Count Ratio values generated according to EQ. 3 may be stored within a look-up table relating Count Ratio values to overload condition values expressed in decibels ($OL_{dB}$). The values stored within the look-up table may be used to determine a maximum gain step size, a first range of Count Ratio values representing a maximum overload condition, a second range of Count Ratio values representing a medium overload condition, and a third range of Count Ratio values representing a minimum overload condition, as discussed above.

During operation, AGC FSM 100 may read the Ta and Thp measurements generated by counters 96, 98, calculate a Count Ratio according to EQ. 3, compare the calculated Count Ratio to the first, second and third ranges of Count Ratio values representing different overload conditions (e.g., a maximum overload condition, a medium overload condition, a minimum overload condition, and a no overload condition) and control the amplifier gain and the gain step size based on the comparison results, similar to that shown in FIG. 5 and described above. For example, AGC FSM 100 may reduce the gain by a maximum gain step size, if the Count Ratio falls within the first range of Count Ratio values representing a maximum overload condition, reduce the gain by a proportional gain step size, if the Count Ratio falls within the second range of Count Ratio values representing a medium overload condition, maintain the gain, if the Count Ratio falls within the third range of Count Ratio values representing a minimum overload condition, and increase the gain by a small gain step size, if the Count Ratio falls below the third range of Count Ratio values.

The AGC circuit embodiments shown in FIGS. 7-10 provide several advantages over conventional AGC circuits, such as reducing settling delay in the AGC loop, enabling large gain steps to be used to reduce amplifier gain without risking overshoot, and avoiding corrupting the demodulated signal. In addition to these advantages, the AGC circuit embodiments shown in FIGS. 7-10 provide a more accurate assessment of overload duration and/or to more precisely control the gain when high energy interferers are present in the received signal along with the desired transmission.

In the AGC circuit embodiments shown in FIGS. 7-10, for example, the Thp and (Ta+Tb) measurements both represent the received signal half period. In some embodiments, the received signal half period can be used to extract or detect a variety of different interference conditions. Under co-channel interference conditions, for example, the received signal half period may be unstable, but on average, may be close to a nominal value (e.g., one-half of the expected received signal period). In the presence of a nearby interferer (e.g., closer than two times the desired received signal frequency), the received signal half period may be, on average, longer or shorter than the nominal value. If the interferer were further away (e.g., ten times the desired received signal frequency), the received signal half period may be much shorter than the nominal value.

In some embodiments, the controller may use the received signal half period (e.g., Thp or (Ta+Tb)) obtained in the AGC circuit embodiments of FIGS. 7-10 to detect a particular interference condition and act accordingly. For example, the controller may use the extracted interference condition to activate averaging on the detected overload conditions when a co-channel interference condition is observed. In another example, the controller may use the extracted interference condition to determine a particular gain adjustment strategy if more than one gain control signal can be used (e.g., the controller may reduce the gain of the RF amplifier 24 first when a faraway interferer is observed, or may reduce the gain of the IF amplifier 30 when a nearby interferer is observed). This enables the AGC circuit embodiments shown in FIGS. 7-10 to provide a more accurate assessment of overload duration and to more precisely control the gain when high energy interferers are present in the received signal along with the desired transmission.

It will be appreciated to those skilled in the art having the benefit of this disclosure that this disclosure is believed to provide a fast ACG circuit and method to control the gain, and the gain step size, of an amplifier based on a duration of a detected overload condition. Further modifications and alternative embodiments of various aspects of the disclosure will be apparent to those skilled in the art in view of this description. It is to be understood that the various embodiments of the AGC circuits and methods shown and described herein are to be taken as the presently preferred embodiments. Elements and materials may be substituted for those illustrated and described herein, parts and processes may be reversed, and certain features of the disclosed embodiments may be utilized independently, all as would be apparent to one skilled in the art after having the benefit of this disclosure. It is intended, therefore, that the following claims be interpreted to embrace all such modifications and changes and, accordingly, the specification and drawings are to be regarded in an illustrative rather than a restrictive sense.

What is claimed is:

1. An automatic gain control (AGC) circuit comprising:
    a peak detector coupled to receive a received signal and a threshold value, the peak detector being configured to detect an overload condition if the received signal exceeds the threshold value;
    an integrator coupled to the peak detector and configured to detect a duration of an overload condition detected by the peak detector; and
    a controller coupled to receive the detected duration from the integrator and configured to control a gain of one or more amplifiers coupled to the AGC circuit, and to control a gain step size, based on the detected duration of the overload condition.

2. The AGC circuit as recited in claim 1, wherein the peak detector comprises:
    a comparator coupled to receive the received signal and the threshold value and configured to output a logic signal indicating whether the received signal exceeds the threshold value or falls below the threshold value;
    a rising edge detector coupled to receive the logic signal from the comparator, wherein the rising edge detector is triggered to output a first control signal when the received signal exceeds the threshold value; and
    a falling edge detector coupled to receive the logic signal from the comparator, wherein the falling edge detector is triggered to output a second control signal when the received signal falls below the threshold value.

3. The AGC circuit as recited in claim 1, wherein the integrator comprises a counter, and wherein the counter is configured to count a number of clock periods of a clock signal during the overload condition.

4. The AGC circuit as recited in claim 3, wherein the controller is coupled to receive a count from the counter, and wherein the controller is configured to compare the count to different ranges of count values representing different overload conditions and to control the gain and the gain step size based on the comparison results.

5. The AGC circuit as recited in claim 4, wherein the controller is configured to:
    reduce the gain by a maximum gain step size, if the count falls within a first range of count values representing a maximum overload condition;
    reduce the gain by a gain step size proportional to the detected duration of the overload condition, if the count falls within a second range of count values representing a medium overload condition;

maintain the gain, if the count falls within a third range of count values representing a minimum overload condition; and increase the gain by a small gain step size, if the count is below the third range of count values.

6. The AGC circuit as recited in claim 5, wherein the first range of count values comprises count values greater than a maximum count value, wherein the second range of count values comprises count values greater than a high count value, but less than or equal to the maximum count value, and wherein the third range of count values comprises count values greater than a low count value, but less than or equal to the high count value.

7. The AGC circuit as recited in claim 5, further comprising a look-up table relating count values to corresponding overload condition values expressed in decibels for at least one frequency of the received signal and at least one frequency of the clock signal.

8. The AGC circuit as recited in claim 7, wherein the controller is further configured to use the look-up table to:
convert the count value into an overload condition value expressed in decibels; and
subtract a target overload condition value expressed in decibels from the overload condition value expressed in decibels to determine the gain step size proportional to the detected duration of the overload condition, which is used to reduce the gain if the count falls within the second range of count values.

9. An automatic gain control (AGC) circuit, comprising:
a peak detector coupled to receive a received signal and a threshold value, the peak detector being configured to detect an overload condition if the received signal exceeds the threshold value;
an integrator coupled to the peak detector and configured to detect a duration of an overload condition detected by the peak detector;
a second peak detector and a third peak detector coupled to receive the received signal and configured to detect when the received signal does not exceed the threshold value;
a second integrator coupled to the second peak detector and the third peak detector, and configured to detect a non-overload duration; and
a controller coupled to receive the detected duration of the overload condition from the integrator and the detected non-overload duration from the second integrator, wherein the controller is configured to control a gain of one or more amplifiers based on the detected duration of the overload condition and the detected non-overload duration.

10. The AGC circuit as recited in claim 9, wherein the controller is configured to:
determine a ratio by dividing the detected duration of the overload condition by a sum of the detected duration of the overload condition and the detected non-overload duration;
compare the ratio to different ranges of ratio values representing different overload conditions; and
control the gain of the one or more amplifiers based on the comparison results.

11. The AGC circuit as recited in claim 10, wherein the controller is configured to:
reduce the gain by a maximum gain step size, if the ratio falls within a first range of ratio values representing a maximum overload condition;
reduce the gain by a proportional gain step size, if the ratio falls within a second range of ratio values representing a medium overload condition;
maintain the gain, if the ratio falls within a third range of ratio values representing a minimum overload condition; and
increase the gain by a small gain step size, if the ratio is below the third range of ratio values.

12. The AGC circuit as recited in claim 11, wherein the first range of ratio values comprises ratio values greater than a maximum ratio value, wherein the second range of ratio values comprises ratio values greater than a high ratio value, but less than or equal to the maximum ratio value, and wherein the third range of ratio values comprises ratio values greater than a low ratio value, but less than or equal to the high ratio value.

13. The AGC circuit as recited in claim 12, further comprising a look-up table relating ratio values to corresponding overload condition values expressed in decibels for at least one frequency of the received signal and at least one frequency of the clock signal.

14. The AGC circuit as recited in claim 13, wherein the controller is further configured to use the look-up table to:
convert the ratio into an overload condition value expressed in decibels; and
subtract a target overload condition value expressed in decibels from the overload condition value expressed in decibels to determine the gain step size proportional to the detected duration of the overload condition, which is used to reduce the gain if the count falls within the second range of count values.

15. An automatic gain control (AGC) circuit, comprising:
a peak detector coupled to receive a received signal and a threshold value, the peak detector being configured to detect an overload condition if the received signal exceeds the threshold value;
an integrator coupled to the peak detector and configured to detect a duration of an overload condition detected by the peak detector;
a second peak detector coupled to receive the received signal, and configured to detect one-half of a period of the received signal;
a second integrator coupled to the second peak detector, and configured to detect a duration of the one-half period of the received signal; and
a controller coupled to receive the detected duration of the overload condition from the integrator and the detected duration of the one-half period of the received signal from the second integrator, wherein the controller is configured to control a gain of one or more amplifiers based on the detected duration of the overload condition and the detected duration of the one-half period of the received signal.

16. The AGC circuit as recited in claim 15, wherein the controller is configured to:
detect an interference condition from the duration of the one-half period of the received signal; and
use the detected interference condition to further control the gain of the one or more amplifiers.

17. The AGC circuit as recited in claim 15, wherein the controller is configured to:
determine a ratio by dividing the detected duration of the overload condition by the detected duration of the one-half period of the received signal;
compare the ratio to different ranges of ratio values representing different overload conditions; and control the gain of the one or more amplifiers based on the comparison results.

18. The AGC circuit as recited in claim 17, wherein the controller is configured to:
reduce the gain by a maximum gain step size, if the ratio falls within a first range of ratio values representing a maximum overload condition;
reduce the gain by a proportional gain step size, if the ratio falls within a second range of ratio values representing a medium overload condition;
maintain the gain, if the ratio falls within a third range of ratio values representing a minimum overload condition; and
increase the gain by a small gain step size, if the ratio is below the third range of ratio values.

19. The AGC circuit as recited in claim 18, further comprising a look-up table relating ratio values to corresponding overload condition values expressed in decibels for at least one frequency of the received signal and at least one frequency of the clock signal.

20. The AGC circuit as recited in claim 19, wherein the controller is further configured to use the look-up table to:
convert the ratio into an overload condition value expressed in decibels; and
subtract a target overload condition value expressed in decibels from the overload condition value expressed in decibels to determine the gain step size proportional to the detected duration of the overload condition, which is used to reduce the gain if the count falls within the second range of count values.

21. A method of gain control, the method comprising:
receiving an input signal;
detecting an overload condition if the received input signal exceeds a threshold value, wherein the detecting an overload condition comprises activating one or more control signals representing a duration of time that the received signal exceeds the threshold value;
detecting a duration of the overload condition by counting a number of clock periods that occur during the duration of the overload condition to generate a count; and
controlling a gain of one or more amplifiers based on the detected duration of the overload condition.

22. The method as recited in claim 21, wherein the controlling a gain of one or more amplifiers comprises:
comparing the count to different ranges of count values representing different overload conditions; and
controlling the gain of one or more amplifiers based on the comparison results.

23. The method as recited in claim 22, wherein the controlling a gain of one or more amplifiers comprises:
reducing the gain by a maximum gain step size, if the count falls within a first range of count values representing a maximum overload condition;
reducing the gain by a gain step size proportional to the duration of the overload condition, if the count falls within a second range of count values representing a medium overload condition;
maintaining the gain, if the count falls within a third range of count values representing a minimum overload condition; and
increasing the gain by a small gain step size, if the count is below the third range of count values.

24. The method as recited in claim 21, further comprising activating one or more additional control signals representing a non-overload duration of time that the received signal does not exceed the threshold value, counting a number of clock periods that occur during the non-overload duration to generate a non-overload count, and generating a count ratio based upon the count divided by the count plus the non-overload count.

25. The method as recited in claim 24, wherein the controlling a gain of one or more amplifiers comprises:
comparing the count ratio to different ranges of count ratio values representing different overload conditions; and
controlling the gain of the one or more amplifiers based on the comparison results.

26. The method as recited in claim 25, wherein the controlling a gain of one or more amplifiers comprises:
reducing the gain by a maximum gain step size, if the count ratio falls within a first range of count values representing a maximum overload condition;
reducing the gain by a gain step size proportional to the duration of the overload condition, if the count ratio falls within a second range of count ratio values representing a medium overload condition;
maintaining the gain, if the count ratio falls within a third range of count ratio values representing a minimum overload condition; and
increasing the gain by a small gain step size, if the count ratio is below the third range of count values.

27. The method as recited in claim 21, further comprising activating one or more additional control signals representing a duration of time corresponding to one-half of a period of the received signal, counting a number of clock periods that occur during the one-half period of the received signal to generate a half period count, and generating a count ratio based upon the count divided by the half period count.

28. The method as recited in claim 27, wherein the controlling a gain of one or more amplifiers comprises:
comparing the count ratio to different ranges of count ratio values representing different overload conditions; and
controlling the gain of the one or more amplifiers based on the comparison results.

29. The method as recited in claim 28, wherein the controlling a gain of one or more amplifiers comprises:
reducing the gain by a maximum gain step size, if the count ratio falls within a first range of count values representing a maximum overload condition;
reducing the gain by a gain step size proportional to the duration of the overload condition, if the count ratio falls within a second range of count ratio values representing a medium overload condition;
maintaining the gain, if the count ratio falls within a third range of count ratio values representing a minimum overload condition; and
increasing the gain by a small gain step size, if the count ratio is below the third range of count values.

30. The method as recited in claim 27, wherein the controlling a gain of one or more amplifiers comprises:
detecting an interference condition from the duration of time corresponding to the one-half period of the received signal; and
using the detected interference condition to further control the gain of the one or more amplifiers.

31. An automatic gain control (AGC) circuit comprising:
a peak detector coupled to receive a received signal and a threshold value, wherein the peak detector is configured to detect an overload condition if the received signal exceeds the threshold value, and wherein the peak detector comprises:
a comparator coupled to receive the received signal and the threshold value and configured to output a logic signal indicating whether the received signal exceeds the threshold value or falls below the threshold value;

a rising edge detector coupled to receive the logic signal from the comparator, wherein the rising edge detector is triggered to output a first control signal when the received signal exceeds the threshold value; and a falling edge detector coupled to receive the logic signal from the comparator, wherein the falling edge detector is triggered to output a second control signal when the received signal falls below the threshold value;

an integrator coupled to the peak detector and configured to detect a duration of an overload condition detected by the peak detector; and a controller coupled to receive the detected duration from the integrator and configured to control a gain of one or more amplifiers coupled to the AGC circuit based on the detected duration of the overload condition.

* * * * *